United States Patent
Nakano

(10) Patent No.: US 7,145,629 B2
(45) Date of Patent: Dec. 5, 2006

(54) EXPOSURE TECHNIQUE

(75) Inventor: Hitoshi Nakano, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 72 days.

(21) Appl. No.: 10/976,848

(22) Filed: Nov. 1, 2004

(65) Prior Publication Data

US 2006/0033893 A1 Feb. 16, 2006

(30) Foreign Application Priority Data

Nov. 4, 2003 (JP) ............................. 2003-374100

(51) Int. Cl.
*G03B 27/42* (2006.01)
(52) U.S. Cl. .......................... 355/30; 355/53
(58) Field of Classification Search .................... None
See application file for complete search history.

(56) References Cited

U.S. PATENT DOCUMENTS 6,665,046 B1  12/2003  Nogawa et al. ............... 355/30
6,704,088 B1  3/2004  Tanimoto ...................... 355/30
6,734,950 B1  5/2004  Nakano ........................ 355/72
6,788,392 B1  9/2004  Nakano ........................ 355/72
6,961,113 B1 * 11/2005  Hayashi et al. ............... 355/30
6,987,554 B1 *  1/2006  Nomoto ....................... 355/53
2002/0145711 A1 * 10/2002  Magome et al. .............. 355/30
2003/0164929 A1  9/2003  Tanimoto ...................... 355/30

FOREIGN PATENT DOCUMENTS

JP          9-218519        8/1997

* cited by examiner

*Primary Examiner*—D. Rutledge
(74) *Attorney, Agent, or Firm*—Fitzpatrick, Cella, Harper & Scinto

(57) ABSTRACT

An atmosphere control technique for an exposure apparatus. An exposure apparatus to which this technique is applied includes, for example, a chamber which contains a space through which exposure light passes, a circulation system which has a path and circulates an inert gas through the path and the chamber, at least one valve provided in the path, a supply system which has a supply port at one end of a zone of the path defined by the at least one valve and supplies an inert gas to the supply port, and an exhaust system which has an exhaust port at the other end of the zone and exhausts a gas from the exhaust port.

14 Claims, 8 Drawing Sheets

EXPOSURE TECHNIQUE

This application claims priority from Japanese Patent Application No. 2003-374100, entitled "EXPOSURE APPARATUS AND ENVIRONMENTAL CONTROL METHOD" and filed on Nov. 4, 2003, the entire contents of which are incorporated herein by reference.

BACKGROUND OF THE INVENTION

1. Field of the Invention

The present invention relates to exposure techniques, and more particularly, relates to an atmosphere control technique which controls an atmosphere in an airtight chamber of an exposure apparatus by circulating an inert gas having a predetermined purity.

2. Description of the Related Art

Hitherto, in manufacturing of a semiconductor element such as an LSI or a VLSI having an ultra fine pattern, a reduction type projection exposure apparatus has been used in which a circuit pattern drawn in a mask is formed onto a substrate coated with a photosensitive agent by printing a reduction projection technique. Concomitant with the improvement in packaging density of semiconductor elements, development of micropatterning techniques has been increasingly required. Accordingly, along with the advancement of a resist process, exposure apparatuses have also been continuously improved for satisfying the requirement of micropatterning techniques.

As a method for improving the resolving power of an exposure apparatus, there may be mentioned a method for further changing the exposure wavelength to a shorter one and a method for increasing the numerical aperture (NA) of a projection optical system.

As for the exposure wavelength, an i-line having a wavelength of 365 nm was developed, and in recent years, a KrF excimer laser having an oscillation wavelength of approximately 248 nm and an ArF excimer laser having an oscillation wavelength of approximately 193 nm have been developed. Furthermore, development of a fluorine ($F_2$) excimer laser having an oscillation wavelength of approximately 157 nm has also been carried out.

An ArF excimer laser having a UV wavelength, in particular, having a wavelength of approximately 193 nm, and a fluorine ($F_2$) excimer laser having an oscillation wavelength of approximately 157 nm are each known to have an oxygen ($O_2$) absorption band in the vicinity of the wavelength band described above. Hence, in an optical path of an exposure optical system including a reticle or a wafer, in order to suppress the decrease in transmittance of exposure light in the air and the generation of ozone, measures have been taken to reduce the oxygen concentration in the optical path to a level on the order of several ppm or less by a purge device using an inert gas such as nitrogen.

In an exposure apparatus using an ArF excimer laser having a UV wavelength, in particular, a wavelength of approximately 193 nm, or a fluorine ($F_2$) excimer laser having a wavelength of approximately 157 nm, ArF excimer laser beams or fluorine ($F_2$) excimer laser beams are very liable to be absorbed by a substance. Hence, the substance mentioned above present in the optical path must be purged to a level on the order of several ppm or less. The same phenomenon as described above can also be observed when moisture is present, and hence, moisture must also be removed to a level on the order of several ppm or less.

Accordingly, the interior of the exposure apparatus, particularly, the interior of the optical path of ultraviolet rays is purged with an inert gas. In addition, a load-lock mechanism is provided at a portion communicating between the interior and the exterior of the exposure apparatus. When to be carried inside the exposure apparatus, a reticle or a wafer is once shielded from the exterior atmosphere by the load-lock mechanism, and after impurities in the load-lock mechanism are purged away with an inert gas, the reticle or wafer is then carried inside the exposure apparatus.

FIG. 1 is a view showing an example of an exposure apparatus using an inert gas circulating air-conditioning device which is formed based on an air circulating air-conditioning technique adapted to a related exposure apparatus.

In FIG. 1, reference numeral 6 indicates a wafer; reference numeral 7 indicates a movable wafer stage which receives a wafer; reference numeral 8 indicates a structural member supporting the wafer stage 7; reference numeral 9 indicates a projection optical system projecting a pattern drawn in a reticle (not shown) onto the wafer 6; and reference numeral 19 indicates a structural member supporting this projection optical system. In addition, reference numeral 1 indicates an airtight chamber isolating the wafer stage 7 and a part of the projection optical system 9 from the exterior atmosphere, a load-lock 2 is provided beside this airtight chamber, and furthermore, between this load-lock 2 and the wafer stage 7, a wafer transfer system 24 is provided. A wafer carried inside the airtight chamber 1 from the outside through the load-lock 2 is placed on the wafer stage 7 by the wafer transfer system 24, and an exposure process is then to be carried out. In addition, a filter box 20 having a dust collector filter 13 is connected to one end of the airtight chamber 1, the dust collector filter 13 being provided at a nozzle thereof, and the filter box 20 is also connected to an air conditioner 4 through a circulation supply path 21. In addition, this airtight chamber 1 has a return hole R, and this return hole R is connected to the air conditioner 4 through a circulation return path 22. An inert gas in the airtight chamber 1 is sucked through this return hole R and is then returned inside the air conditioner 4 through the circulation return path 22. In the air conditioner 4, a cooling device 10 and a heating device 11 are provided, and for example, after the temperature of an inert gas blown out from the dust collector filter 13 is sensed by a temperature sensor Ts1, the operation of the cooling device 10 and the heating device 11 are controlled by a temperature control device TC so as to always maintain the temperature at a predetermined level. An inert gas passing through the cooling device 10 and the heating device 11 is supplied by a blower 3 to the filter box 20 through the circulation supply path 21. When an inert gas passes through a chemical filter 12 and the dust collector filter 13, organic and inorganic impurity gases are removed by the former and dust is removed by the latter, and the inert gas is again blown into the airtight chamber 1.

Furthermore, an inert gas supply path S3 is connected to the circulation return path 22, and by an inert gas supply device not shown in the figure, an inert gas having a high purity is always supplied in those circulation paths. In addition, an inert gas exhaust path S2 is connected to the circulation supply path 21, an impurity monitoring detector 14a is provided for this exhaust path S2, and a part of the inert gas in those circulation paths is always exhausted outside and is monitored. As described above, since an inert gas having a high purity is always supplied while circulating through the airtight chamber 1 and the air conditioner 4, an inert gas atmosphere can be obtained in the airtight chamber 1 in which predetermined oxygen and moisture concentrations are achieved and in which a predetermined temperature is maintained.

In addition, for example, in Japanese Patent Laid-Open No. 9-218519, in order to decrease the amount of an inert gas, a method has been disclosed which purges a reticle space receiving a reticle stage with an inert gas. According to the method described above, in addition to an inert gas supply source and a supply path, an inert gas circulation path is formed having a blower, a heat exchanger, and a dust collector filter, and after an inert gas in the reticle space and an inert gas supplied from the supply source are mixed together, the mixed inert gas thus obtained is refined by the heat exchanger and the dust collector filter and is then again supplied into the reticle space, so that the amount of the inert gas supplied from the supply source is decreased.

As described above, in an exposure apparatus using UV rays, in particular, using ArF excimer laser beams or fluorine ($F_2$) excimer laser beams, since ArF excimer laser beams or fluorine ($F_2$) excimer laser beams are very liable to be absorbed by oxygen and moisture, in order to obtain satisfactory transmittance and stability, oxygen and moisture must be sufficiently removed.

However, in the case of the related device described above, there has been a problem in that a time required for changing the state in which the airtight chamber 1 and the air conditioner 4 are sufficiently exposed to the atmosphere to the state of a predetermined inert gas atmosphere is very long, that is, a time required for an initial purge is disadvantageously very long. In the initial purge, in general, while not being circulated, an inert gas having a high purity is supplied so that air or a mixture of air and an inert gas present inside is exhausted.

As can be apparently seen in FIG. 1, the case described above is equivalent to that in which an inert gas supplied from the inert gas supply path S3 reaches the inert gas exhaust path S2 while pushing out air present in the apparatus. However, in this case, there are two paths, that is, there are a path communicating with the inert gas exhaust path S2 through the airtight chamber 1 and a path communicating with the inert gas exhaust path S2 through the air conditioner 4. The two paths described above have different volumes from each other, and an inert gas may easily pass through one of the paths as compared to the other path. For example, compared to the volume of the airtight chamber 1 including the filter box 20, the air conditioner 4 has a small volume, and hence an inert gas easily passes therethrough. In this case, since an inert gas supplied from the inert gas supply path S3 preferentially flows through the path at the air conditioner 4 side and is exhausted from the inert gas exhaust path S2, the replacement of air with an inert gas is readily carried out at the air conditioner 4 side. On the other hand, air at the airtight chamber 1 side spreads toward the air conditioner 4 side primarily by a diffusion phenomenon, in other words, an inert gas at the air conditioner 4 side spreads toward the airtight chamber 1 side primarily by a diffusion phenomenon, and the air is gradually replaced with an inert gas. As described above, of the two paths in which the replacement is performed with an inert gas, the replacement is dominantly carried out by a diffusion phenomenon in one of the two paths, and as a result, a very long time is required for the initial purge on the whole. Accordingly, the time required for startup of an apparatus is increased, and as a result, the productivity thereof is disadvantageously degraded.

In addition, a large amount of moisture is adsorbed onto surfaces of substances exposed to the atmosphere. In particular, since many resins have hydrophilic properties or moisture absorption properties, moisture is unlikely to be desorbed from the surface of a resin as compared to the surface of a metal, and hence, a problem may arise in that a large amount of moisture adsorbed on a resin is continuously desorbed for a long period of time. Even if a fluorinated resin having a relatively superior moisture desorption property is used, it was confirmed by the inventor of the present invention that the moisture desorption property of a fluorinated resin is inferior to that of a metal by one order of magnitude or more.

However, many types of resin materials have been used for various units forming an exposure apparatus. In particular, resins must be used as pipe materials and coating materials for cables in view of assembly density and workability. Hence, in a reticle space or a wafer space in which resin members are inevitably provided, even when the purge is performed with an inert gas having a high purity, moisture adsorbed onto the surface of the materials is gradually being desorbed for a long period of time, and as a result, it will take several tens of hours to enable the moisture to reach a predetermined concentration. Accordingly, the time required for startup of an apparatus is increased, and as a result, the productivity thereof is disadvantageously degraded. Furthermore, in order to obtain a predetermined moisture concentration, a larger amount of an inert gas having a high purity must be continuously supplied from the supply source, and as a result, the running cost of the apparatus is disadvantageously increased.

In addition, when the inert gas circulation path is formed in a reticle space or a wafer space, the dust collector filter must be provided upstream of the aforementioned space. This dust collector filter has a structure in which a fabric filter medium intrinsically having a large surface area is repeatedly folded and placed in a housing so that a large amount of a gas flow is processed with a low pressure loss, and the total surface area of the fabric filter medium with which the gas flow is brought into contact is tremendously large. Furthermore, since a glass or a fluorinated resin is used as the filter medium, a large amount of moisture adsorbed onto the surface thereof is disadvantageously being desorbed for a long period of time. In addition, whenever necessary, the chemical filter may be provided upstream of this dust collector filter in some cases. As a filter media of the chemical filter, for example, an ion exchange resin, a granular or fabric active carbon, or an inorganic ceramic may be used; however, as is the case of the dust collector filter described above, the surface thereof is large, and as a result, a large amount of moisture adsorbed onto the surface of the filter medium is disadvantageously being desorbed for a long period of time. For example, active carbon adsorbs moisture at a content of approximately 5% to 50% on a weight basis at 25° C. and at a relative humidity of 40% to 80%. In a chemical filter containing, for example, 1 kg of active carbon in a dry state, approximately up to 500 cc of absorbed moisture is present, and when this filter is placed in a dry atmosphere at a relative humidity of approximately 3%, most of the moisture thus adsorbed is evaporated in the atmosphere. Of course, onto other chemical filters and dust collector filters, a considerable amount of moisture is adsorbed, and the same phenomenon as described above surely occurs. After the dust collector filter or the chemical filter described above is used, although the purge is carried out with an inert gas having a high purity in a reticle space or a wafer space, water molecules adsorbed onto the surface of the filter medium are being desorbed for a long period of time, and it will take several tens of hours to enable the moisture to reach a predetermined concentration. Accordingly, the time required for startup of the apparatus is increased, and as a result, the productivity thereof is disadvantageously degraded.

Furthermore, in order to obtain a predetermined moisture concentration, a larger amount of an inert gas having a high purity must be continuously supplied from the supply source, and as a result, the running cost of the apparatus is disadvantageously increased. In addition, besides moisture, impurities in the atmosphere and in a clean room may be adsorbed onto filters and the like during the transportation and the assembly in some cases, and as a result, the impurities themselves or those dissolved in moisture adsorbed on the surfaces of the filters and the like disadvantageously behave in the same manner as that of the moisture described above.

In addition, when maintenance or repair of various units placed in a reticle space or a wafer space is performed, the space must be exposed to the atmosphere. In this case, at the same time, the dust collector filter and the chemical filter are also exposed to the atmosphere. As a result, exterior moisture and impurities are again adsorbed onto the surfaces of the filter media of the filters, and even when the purge is re-started using an inert gas after the maintenance is completed, a long period of time and a large amount of an inert gas having a high purity are required to obtain a predetermined moisture concentration and impurity concentration, and as a result, the degradation in productivity of the apparatus and rapid increase in running cost thereof disadvantageously occur.

Furthermore, when an exposure apparatus is operated while an inert gas is circulated inside the airtight chamber, wafers and reticles are frequently carried into the airtight chamber. Of course, in this case, outside air is prevented from entering the airtight chamber by the use of a load-lock. However, on the wafer surface, the surface of a resist provided thereon, and the surface of a reticle, moisture and impurities in the exterior atmosphere are being adsorbed, and before the moisture and impurities thus adsorbed are desorbed to obtain an ideal equilibrium state, the wafer and the reticles are generally carried into the airtight chamber. Otherwise, the productivity required for an exposure apparatus cannot be ensured. Hence, since moisture and impurities are always carried inside the airtight chamber during operation by the wafer and the reticle carried into the exposure apparatus, most of the moisture and impurities are adsorbed onto the surfaces of the filter media of the chemical filter and the dust collector filter while they pass through the circulation paths, and as a result, as the amount of adsorption is increased, the concentration of moisture and impurities in the airtight chamber are gradually increased. This increase in concentration of the moisture and impurities causes the degradation in transmittance in an exposure light atmosphere and the generation of haze of optical members, and as a result, a problem may arise in that the productivity of the exposure apparatus is degraded.

Accordingly, development has been desired in which, while an inert gas is circulated, an inert gas concentration at a predetermined level is obtained in a wafer space or a reticle space within a short period of time required for startup by the use of a small amount of an inert gas having a high purity, and in which the predetermined concentration level described above is then maintained.

Furthermore, development has also been desired in which the concentrations of moisture and impurities in an inert gas circulating atmosphere, which are increased during the operation, are recovered to a predetermined level within a short period of time.

SUMMARY OF THE INVENTION

Accordingly, the present invention was made in consideration of the problems described above, and an object of the present invention is to provide an atmosphere control technique preferably applied to an exposure apparatus using ultra violet rays as exposure light.

According to the present invention, the foregoing object is attained by providing an exposure apparatus which comprises: a chamber which contains a space through which exposure light passes; a circulation system which has a path and circulates an inert gas through the path and the chamber; at least one valve provided in the path; a supply system which has a supply port at one end of a zone of the path defined by the at least one valve and supplies an inert gas to the supply port; and an exhaust system which has an exhaust port at the other end of the zone and exhausts a gas from the exhaust port.

Further, the foregoing object is also attained by providing a device manufacturing method which comprises steps of: exposing a substrate to a pattern using the exposure apparatus described above; and developing the exposed substrate.

Furthermore, the foregoing object is also attained by providing an atmosphere control method for an exposure apparatus which comprises a chamber which has a space through which exposure light passes and a circulation system which has a path and circulates an inert gas through the path and the chamber. The atmosphere control method comprises steps of: closing at least one valve provided in the path; supplying an inert gas to one end of a zone of the path defined by the at least one valve; and exhausting a gas from the other end of the zone.

FIG. 4 is a schematic view showing a gas circulating air-conditioning device as an inert gas circulating device of an exposure apparatus according to Embodiment 2 of the present invention. Unlike the case of Embodiment 1 shown in FIG. 3, in this embodiment, filters, such as the dust collector filter 13 and the chemical filter 12 provided at the airtight chamber 1 side, are received in a filter box 5, which is a separate housing formed so that a gas in the space thereof can be independently replaced with an inert gas. In addition, unlike the case shown in FIG. 3, a circulation path valve CV2 is provided in a circulation relay path 23 connecting between the air conditioner 4 and the filter box 5, and an inert gas exhaust path S4 and an inert gas supply path S1 are provided upstream and downstream of the circulation path valve CV2. In FIG. 4, when the circulation path valves CV1 and CV2 are closed, the airtight state of the space in the filter box 5 can be maintained, and furthermore, when an inert gas is supplied to the circulation relay path 23 from an inert gas supply device (not shown) through the inert gas supply path S1 so as to exhaust a gas in the space of the filter box 5 from the inert gas exhaust path S2, the gas of the space of the filter box 5 can be replaced with an inert gas. As described above, when the space in which the filters are received is formed to be sealable, and a gas in the space can be independently replaced with an inert gas, a step of depleting moisture contained in the filters, which are most liable to adsorb moisture can be performed independently of other spaces. Hence, when an exposure apparatus is installed for startup, for example, although the installation and the startup are not finished yet, the step for depleting moisture contained in the filters, which generally lasts for several tens of hours, can be carried out along with other installation and startup steps, and as a result, it can be expected that the total working hours will be decreased.

Other objects and advantages besides those discussed above shall be apparent to those skilled in the art from the description of a preferred embodiment of the invention which follows. In the description, reference is made to accompanying drawings, which form a part thereof, and which illustrate an example of the invention. Such an example, however, is not exhaustive of the various embodiments of the invention, and therefore reference is made to the claims which follow the description for determining the scope of the invention.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

An exposure apparatus having an inert gas circulating device of the present invention is not limited to the following embodiments, and the present invention may also be applied to a known exposure apparatus in which ultra violet rays are used as exposure light, the interior is purged with an inert gas, and a mask pattern is projected onto a photosensitive substrate through a projection optical system.

In addition, ultra violet rays used as the exposure light for the exposure apparatus of the present invention is not particularly limited to light having a specific wavelength; however, as was described in the related technique, among ultra violet rays, an ArF excimer laser having a wavelength of approximately 193 nm and a fluorine ($F_2$) excimer laser having a wavelength of approximately 157 nm are effectively used. Hereinafter, with reference to the figures, the embodiments of the present invention will be described.

Embodiment 1

Figure 1:
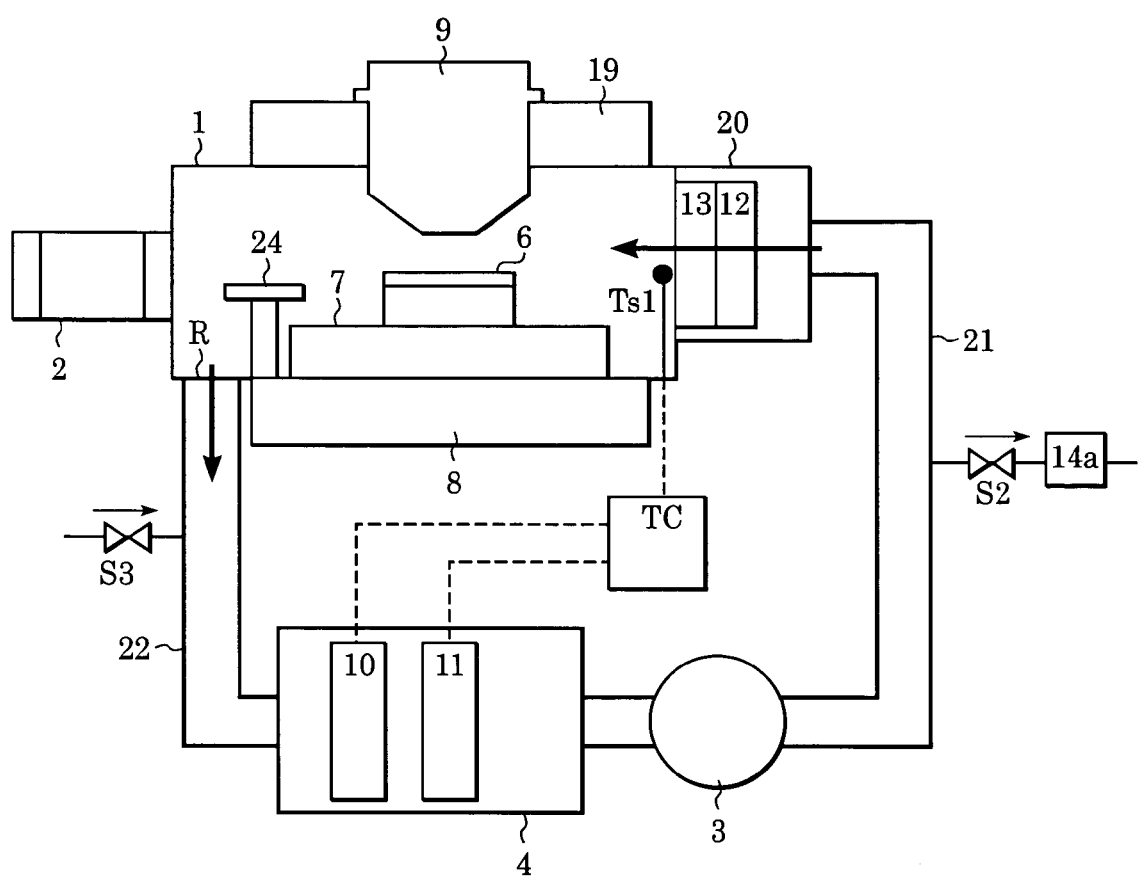
FIG. 1 is a schematic view showing the structure of a projection exposure apparatus using a related inert gas circulating air-conditioning device.
Figure 2:
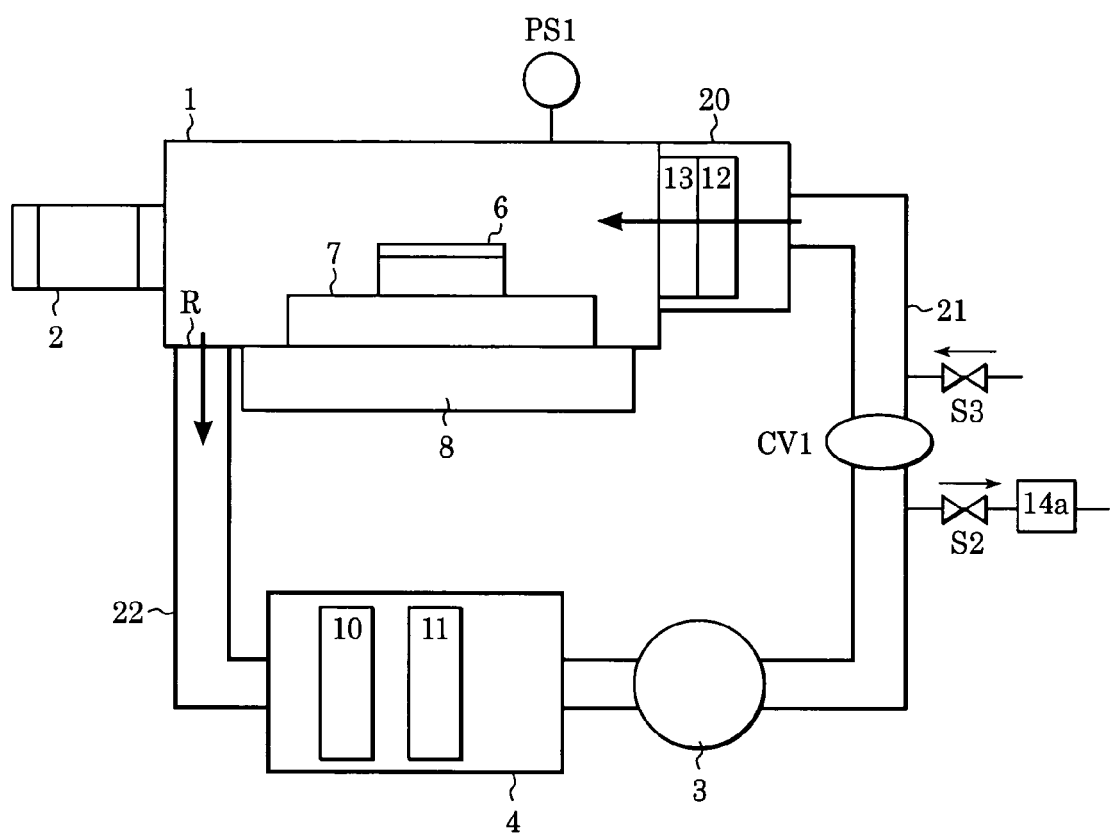
FIG. 2 is a schematic view showing the structure of a gas circulating air-conditioning device as an inert gas circulating device of an exposure apparatus according to Embodiment 1 of the present invention.
Figure 3:
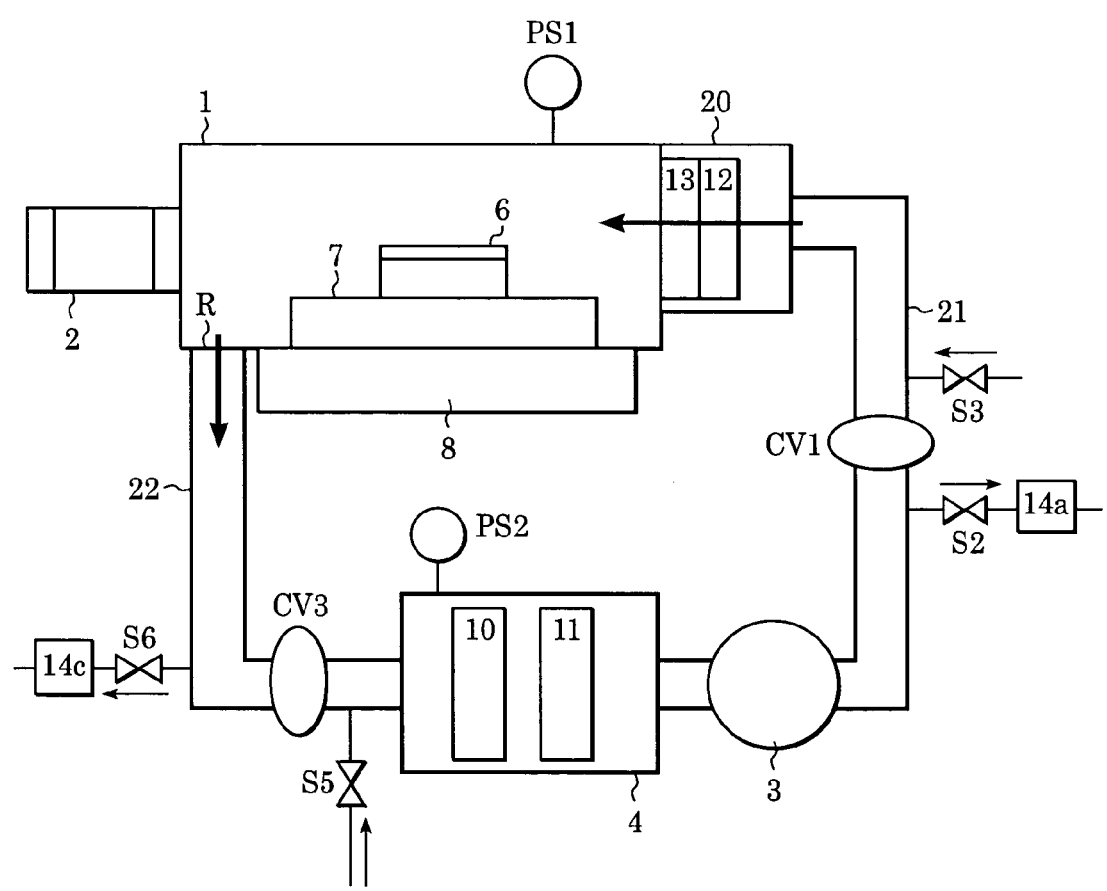
FIG. 3 is a schematic view showing the structure of another gas circulating air-conditioning device as an inert gas circulating device of the exposure apparatus according to Embodiment 1 of the present invention.

FIGS. 2 and 3 are schematic views each showing a gas circulating air-conditioning device (atmosphere control device) as an inert gas circulating device of an exposure apparatus according to Embodiment 1 of the present invention. The same reference numerals of the constituent elements of the inert gas circulating device in FIG. 1 shown as the case of the related device designate the same constituent elements of this embodiment, and a description thereof will be omitted. In addition, the projection optical system 9, the structural member 19, the wafer transfer system 24, the temperature sensor Ts1, and the temperature control device TC are not shown in the figure and will not be described. This embodiment will be described using the airtight chamber 1 which receives a wafer side by way of example. However, the same situation as in the case mentioned above can be naturally contemplated at a reticle side. The airtight chamber 1 is approximately sealed from the exterior atmosphere and is substantially airtight.

Unlike the case of the related device shown in FIG. 1, in this embodiment shown in FIG. 2, a circulation path valve CV1 capable of closing the circulation supply path 21 is provided therein, and in addition, the inert gas exhaust path S2 and the inert gas supply path S3 are provided upstream and downstream of the circulation path valve CV1, respectively.

While the exposure apparatus is operated, at least this inert gas circulating air-conditioning device is also operated. That is, the circulation path valve CV1 is in an open state, and an inert gas containing oxygen and moisture at a predetermined concentration or less is circulated between the airtight chamber 1 and the air conditioner (temperature controller) 4 while an inert gas having a high purity is being supplied to the circulation path by an inert gas supply device (not shown) through the inert gas supply path S3 and while an inert gas in the airtight chamber 1 is being exhausted from the inert gas exhaust path S2. In FIGS. 2 and 3, of course, the circulation path valve CV1, the inert gas exhaust path S2, and the inert gas supply path S3, which are provided for the circulation supply path 21, may be provided at the circulation return path 22 side.

After the airtight chamber 1 and the air conditioner 4 are exposed to the atmosphere because of maintenance, inspection, repair, or the like, when an inert gas is again to be circulated therethrough, the following initial purge operation is performed as preparation for the inert gas circulation. First, while the circulation path valve Cv1 is closed, an inert gas having a high purity is supplied to the circulation path through the supply path S3. The inert gas thus supplied flows toward the airtight chamber 1, and at the same time, air present in the airtight chamber 1 and air present in the air conditioner 4 are smoothly and rapidly pushed outside in good order, that is, without causing a turbulence flow, through the exhaust path S2 provided at the other end of the circulation path. In this case, the inert gas supply path S3 and the inert gas exhaust path S2 are preferably provided as close as possible to the circulation path valve Cv1 so as to minimize the dead spaces for the inert gas flow. When a gas exhausted from the exhaust path S2 is changed from air to an inert gas containing air, and when the oxygen concentration or the moisture concentration detected by the impurity monitoring detector 14a reaches a predetermined value, the circulation path valve CV1 is opened, and while the supply and the exhaust of an inert gas having a high purity is still being carried out, the air conditioner 4 and the blower 3 functioning as a transporting device are operated, thereby circulating an inert gas. As the flow volume of an inert gas having a high purity supplied from the gas supply path S3 is increased, the time required for the initial purge can be decreased. Hence, the inert gas supply device (not shown in the figure) preferably has functions in which a relatively large amount of an inert gas is supplied for the initial purge in order to decrease the purge time and in which, in circulation of an inert gas, the supply amount of an inert gas is decreased to an essential minimum flow volume for maintaining a predetermined impurity. As a result, the improvement in productivity and the decrease in running cost of the apparatus can be preferably achieved.

In addition, as shown in FIG. 3, unlike the structure shown in FIG. 2, a circulation path valve CV3 may also be provided in the circulation return path 22, and at the two ends of the circulation path valve CV3, a supply path S5 and an exhaust path S6 may also be provided. When the circulation path valves CV1 and CV3 are closed, the space of the airtight chamber 1 and the space of the air conditioner 4 are separated from each other. Hence, for example, when the airtight chamber 1 is exposed to the atmosphere for maintenance, inspection, or the like after the circulation of an inert gas is stopped, the air conditioner 4 can be placed in an airtight state, and as a result, the impurity of an inert gas in the air conditioner 4 can be prevented from being degraded. Even when the airtightness of the space at the air conditioner 4 side is not sufficient, it is naturally understood that a predetermined impurity can be continuously maintained by continuously replacing an inert gas by the use of the inert gas supply path S5 and the exhaust path S2. In addition, the flow volume of an inert gas supplied through the inert gas supply path S5 can be set so that the moisture concentration or the oxygen concentration detected by the impurity monitoring detector 14a is a predetermined value or less. Furthermore, an inert gas volume control device (not shown) may be provided, and a signal based on the moisture concentration or the oxygen concentration detected by the impurity monitoring detector 14a may be outputted to this inert gas control device. In addition, by this inert gas volume control device, the flow volume of the inert gas thus supplied may be feedback-controlled so that the moisture concentration or the oxygen concentration is always set to a predetermined value or less. Hence, the purity of an inert gas in the space of the air conditioner 4 can be maintained by an optimum small flow volume, and as a result, the running cost can be advantageously decreased.

In addition, in order to recover the circulation state, the initial purge is first performed with an inert gas so that the space at the airtight chamber 1 side which was exposed to the atmosphere has a predetermined impurity concentration. That is, while the circulation path valves CV1 and CV3 are both closed, and the purity of an inert gas in the space of the air conditioner 4 side is being maintained as described above, an inert gas is supplied to the space of the airtight chamber 1 side through the inert gas supply path S3, and a gas in this space is exhausted through the inert gas exhaust path S6. Accordingly, the gas in the space of the airtight chamber 1 can be replaced with an inert gas independently of the space at the air conditioner 4 side. Next, when the impurity concentration detected by an impurity monitoring detector 14c reaches a predetermined concentration while the impurity concentration detected by the impurity monitoring detector 14a is maintained at a predetermined level, the airtight chamber 1 and the air conditioner 4 are allowed to communicate with each other through one communication path so that gases in both spaces thus communicating with each other are replaced with an inert gas. For example, after the circulation path valve CV3 is opened so that the space of the airtight chamber 1 and the space of the air conditioner 4 are allowed to communicate with each other by the circulation return path 22, the supply of an inert gas from the inert gas supply path S5 is stopped, and the exhaust path S6 is closed. In this case, when the circulation path valve CV1 is closed, and an inert gas is supplied from the inert gas supply path S3 and is exhausted from the exhaust path S2, gases in the two spaces of the airtight chamber 1 and the air conditioner 4 can be continuously replaced with an inert gas. Furthermore, when the impurity concentration detected by the impurity monitoring detector 14a reaches a predetermined concentration, the circulation path valve CV1 is opened, and while the supply and exhaust of an inert gas are still being continued, an inert gas is circulated by operating the air conditioner 4 and the blower 3. As described in Embodiment 1, when the flow volume of an inert gas supplied for the circulation is changed from that for the initial purge, of course, the running cost is preferably decreased. In addition, in the process described above, the opening of the circulation path valve and the replacement with an inert gas are performed in a stepwise manner, so that the circulation operation is performed. However, when the impurity concentrations of the spaces of the airtight chamber 1 and the air conditioner 4 separated therefrom each reach a predetermined concentration, the circulation path valves CV1 and CV3 may be simultaneously opened so as to start the circulation operation.

In this embodiment, although the case in which the airtight chamber 1 side is exposed to the atmosphere is described, the same case as described above can be performed when the air conditioner 4 side is exposed to the atmosphere, and hence the space is not particularly limited. In addition, the circulation path valve CV1 may be opened instead of the circulation path valve CV3 so that the space of the airtight chamber 1 and the space of the air conditioner 4 are allowed to communicate with each other, and the supply from the inert gas supply path S3 and the exhaust from the exhaust path S2 may be stopped, so that the replacement with an inert gas is performed using the inert gas supply path S5 and the exhaust path S6.

In addition, when the state in which both the airtight chamber 1 and the air conditioner 4 are exposed to the atmosphere because of maintenance, inspection, repair, or the like is changed to the state in which an inert gas is again circulated, the following initial purge operation may be performed as preparation for the inert gas circulation. That is, while the circulation path valves CV1 and CV3 are both being closed, the space of the airtight chamber 1 and the space of the air conditioner 4 can be processed simultaneously and independently by the initial purge using the inert gas supply path S3 and the exhaust path S6 and using the inert gas supply path S5 and the exhaust path S2, respectively. Accordingly, the volume of the space which is to be processed by the initial purge can be decreased with respect to one set of the inert gas supply path and the exhaust path, and hence the time required for the initial purge can be advantageously further decreased. Furthermore, when the impurity concentrations of the two spaces, which are detected by the impurity monitoring detectors 14a and 14c, reach respective predetermined impurity concentrations, as is the case described above, the airtight chamber 1 and the air conditioner 4 are allowed to communicate with each other through one communication path so that the spaces thus communicating with each other can be replaced with an inert gas.

Embodiment 2

Figure 4:
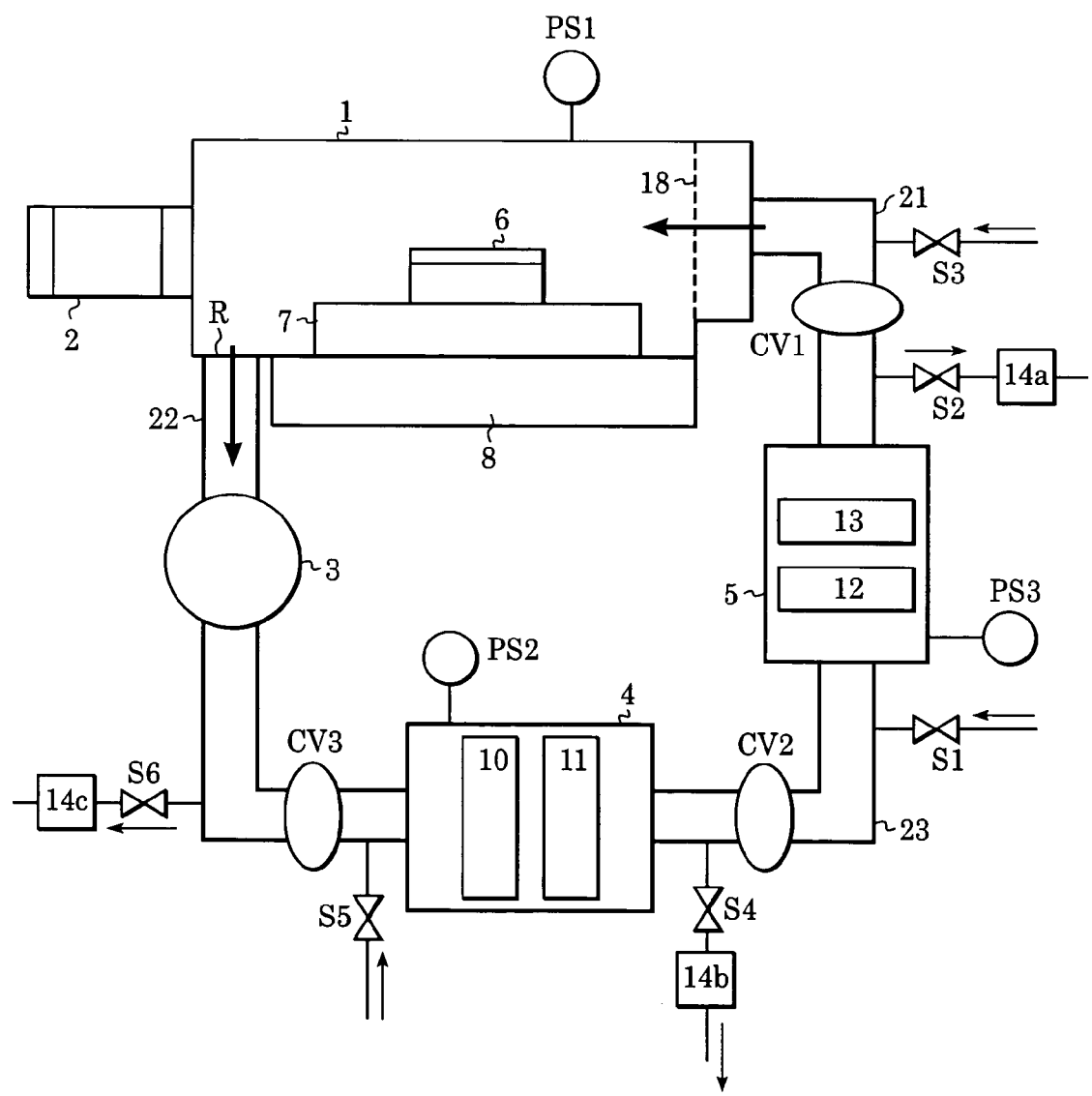
FIG. 4 is a schematic view showing the structure of a gas circulating air-conditioning device as an inert gas circulating device of an exposure apparatus according to Embodiment 2 of the present invention.

FIG. 4 is a schematic view showing a gas circulating air-conditioning device as an inert gas circulating device of an exposure apparatus according to Embodiment 2 of the present invention. Unlike the case of Embodiment 1 shown in FIG. 3, in this embodiment, filters such as the dust collector filter 13 and the chemical filter 12 provided at the airtight chamber 1 side, are received in a filter box 5, which is a separate housing formed so that a gas in the space thereof can be independently replaced with an inert gas. In addition, unlike the case shown in FIG. 3, a circulation path valve CV2 is provided in a circulation relay path 23 connecting between the air conditioner 4 and the filter box 5, and an inert gas exhaust path S4 and an inert gas supply path S1 are provided upstream and downstream of the circulation path valve CV2. In FIG. 4, when the circulation path valves CV1 and CV2 are closed, the airtight state of the space in the filer box 5 can be maintained, and furthermore, when an inert gas is supplied to the circulation relay path 23 from an inert gas supply device (not shown) through the inert gas supply path S1 so as to exhaust a gas in the space of the filter box 5 from the inert gas exhaust path S2, the gas of the space of the filter box 5 can be replaced with an inert gas. As described above, when the space in which the filters are received is formed to be sealable, and a gas in the space can be independently replaced with an inert gas, a step of depleting moisture contained in the filters which are most liable to adsorb moisture can be performed independently of other spaces. Hence, when an exposure apparatus is installed for startup, for example, although the installation and the startup are not finished yet, the step for depleting moisture contained in the filters, which generally lasts for several tens of hours, can be carried out along with other installation and startup steps, and as a result, it can be expected that the total working hours will be decreased.

In addition, even when the airtight chamber 1 and the air conditioner 4 are exposed to the atmosphere because of maintenance, inspection, or the like, an inert gas atmosphere can be maintained in the filter box 5, and hence when an exposure apparatus is re-started after maintenance, inspection, or the like, the step of depleting moisture may not always be required. Hence, the time required for the re-startup can be decreased, and as a result, the productivity of the apparatus can be advantageously improved.

In addition, in FIG. 4, for example, when the airtight chamber 1 is exposed to the atmosphere because of maintenance, inspection, or the like, by closing the circulation path valves CV1 and CV3, the space including the air conditioner 4 and the filter box 5 can be placed in an airtight state, and in this case, the circulation path valve CV2 is not necessarily closed. Of course, when the airtightness of one of the spaces of the air conditioner 4 and the filter box 5 is not sufficient, after the circulation path valve CV2 is closed, a gas in the space having insufficient airtightness may be efficiently replaced with an inert gas, and in this case, the inert gas supply path S1 and exhaust path S4 are not necessarily used. Of course, when the air conditioner 4 or the filter box 5 is exposed to the atmosphere, the other two spaces may be processed in the same manner as that described above. Accordingly, in this embodiment, since two adjacent spaces are substantially regarded as one space, the replacement can be performed with an inert gas using one set of the inert gas supply path and exhaust path, and even when the airtightness of the two adjacent spaces is insufficient, the volume of an inert gas used for the replacement can be advantageously decreased.

In addition, in a general circulation operation, for example, an inert gas is supplied from the inert gas supply path S3 and is exhausted from the exhaust path S2, and by the impurity monitoring detector 14a, the impurity concentration in the circulation path can be detected. In this case, by exhausting a small amount of an inert gas to impurity monitoring detectors 14b and 14c through the inert gas exhaust paths S4 and S6, respectively, the impurity concentrations can be detected at individual points. Accordingly, the impurity concentrations in the circulation operation can be detected at the downstream sides of the spaces of the airtight chamber 1, the air conditioner 4, and the filter box 5, and when the impurity concentration is degraded by an unexpected situation such as an accident, by comparing the individual impurity concentrations with each other, a space causing the unexpected situation can be determined. Furthermore, when this impurity concentration exceeds a predetermined value, by closing the circulation path valves provided so as to sandwich the space causing the unexpected situation, the other spaces having no problem can be placed in an airtight state and can be at least prevented from being contaminated with impurities. Hence, after the cause of the unexpected situation is removed, the time required for the recovery can be advantageously decreased. In this case, when a gas in the space having no problem is being continuously replaced with an inert gas, the impurity concentration can be more stably decreased.

In addition, in FIG. 4, instead of the dust collector filter 13, a smoothing member 18 is provided at a circulating gas nozzle of the airtight chamber 1. A circulating gas passing through the smoothing member 18 has less variation in velocity and flows into the airtight chamber 1 as a more laminar flow, and hence the increase in variation of an optical path of a range interferometer can be suppressed. As this smoothing member 18, for example, a porous plate made of a metal or a ceramic, a porous material, or a mesh material may be used.

Embodiment 3

Figure 5:
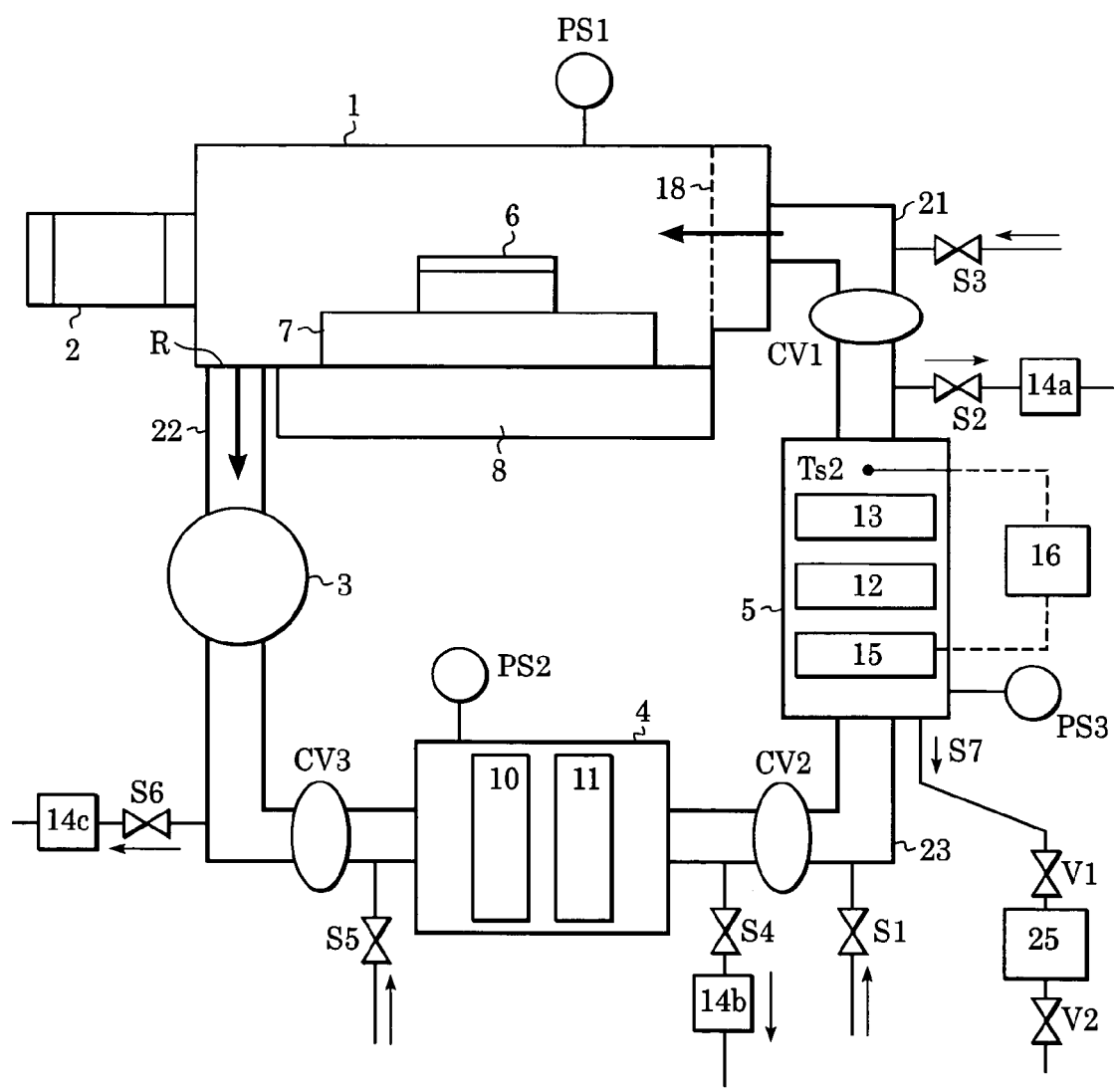
FIG. 5 is a schematic view showing the structure of a gas circulating air-conditioning device as an inert gas circulating device of an exposure apparatus according to Embodiment 3 of the present invention.

FIG. 5 is a schematic view showing a gas circulating air-conditioning device as an inert gas circulating device of an exposure apparatus according to Embodiment 3 of the present invention. Unlike the Embodiment 2 shown in FIG. 4, in this embodiment, there are provided a heating device 15 as a filter heating device for heating the filters received in the filter box 5, a temperature sensor Ts2 for sensing a temperature in the filter box, and a temperature control device 16 for controlling an output of the heating device 15 to set the temperature sensed by the temperature sensor Ts2 to a predetermined value, so that a function of depleting moisture is additionally formed in which moisture adsorbed onto the filters is removed outside by heating. In addition, as shown in FIG. 5, there are provided a drain line S7 communicating with the filter box 5, a drain tank 25 connected to the drain line S7, and valves V1 and V2 connected to two ends of this drain tank 25, so that when gathering in the filter box 5, condensed water is preferably removed outside.

Hereinafter, a method for depleting moisture contained in the filters, according to this embodiment, will be described. First, in the state in which the blower 3 and the air conditioner 4 are stopped, the circulation path valves CV1 and CV2 are closed. At a time between right before and right after closing the circulation path valves CV1 and CV2, the supply of inert gas from the inert gas supply path S1 is started to exhaust a gas in the filter box 5 outside through the exhaust path S2 so that the replacement with an inert gas is continuously performed in the filter box 5. Furthermore, the valve V1 positioned upstream of the drain tank 25 is opened, and the valve V2 positioned downstream thereof is closed. Next, the heating device 15 is driven, and an output thereof is feedback-controlled based on ambient temperature of the filter box 5, which is measured using the temperature sensor Ts2, by the temperature control device 16 with an algorithm such as a PID control so that the temperature of the chemical filter 12 and the dust collector 13 are set to predetermined values.

As a temperature for heating the filters in order to remove moisture adsorbed thereon, a higher temperature is preferable since the time required for depleting moisture can be decreased; however, as a practical temperature, the temperature is ideally increased to approximately 110 to 130° C. which corresponds to adsorption activation energy between water molecules. In this case, the heat resistant temperature of a filter to be heated must be equal to or higher than that mentioned above, and a filter medium made of a glass fiber or a PTFE fiber and a filter medium made of active carbon or an inorganic material may be used for the dust collector filter 13 and the chemical filter 12, respectively. A chemical filter 12 having a highest heat resistant temperature is made by using an inorganic material as a filter medium, and as a commercially available product, for example, a ceramic honeycomb filter "TIOS-DA" manufactured by Takasago Thermal Engineering co., Ltd., may be mentioned, which can absorb polar molecules even in a dry atmosphere. However, for gaskets for forming the dust collector filter and the chemical filter and sealing materials for fixing the filter medium to filter frames by adhesion, resins such as EPDM and polyurethane having inferior heat resistance are generally used, and the heat resistant temperature and the working maximum temperature thereof are generally in the range of 60 to 80° C. Accordingly, the gasket and sealing material forming the filter must have a heat resistance at least equivalent to that of the filter medium, and in particular, a rubber or a resin containing silicone or fluorine is preferably used as a raw material. Of course, for the chemical filter, the airtightness between the filter frame and the filter medium is not so much important, and hence, without using sealing materials and gaskets, the same effect as that obtained therewith may be obtained in many cases. In addition, when a general filter having a low heat resistant temperature is used, the temperature is preferably increased to at least 60° C. or more in order to decrease the time for depleting moisture.

As described above, by replacing a gas in the filter box 5 with an inert gas while the filters are heated, a larger amount of moisture adsorbed on the filters is desorbed and evaporated into an inert gas, and the inert gas containing this moisture is exhausted outside through the inert gas exhaust path S2. The moisture concentration in the filter box 5 is substantially in a saturated state at the initial heating stage, and when the replacement by heating and with an inert gas is continued, the moisture concentration can be rapidly decreased. Subsequently, while the replacement with an inert gas is continued, when the heating device 15 is stopped so that the temperatures of the filters and an atmosphere thereof are decreased to room temperature, the amount of moisture desorbed from the filters is decreased, and the moisture concentration in the surrounding space is more rapidly decreased. In addition, in the case in which condensed water gathers in the drain tank 25, when the temperatures of the filters and the atmosphere are decreased to room temperature, the valve VI provided upstream of the drain tank 25 is closed, and the valve V2 provided downstream thereof is opened so as to discharge the condensed water outside. By the steps described above, the moisture concentration in the filter box 5 can be decreased to the range of several hundred ppm to several ppm within a short period of time, such as several hours.

In FIG. 5, the drain line S7 and the exhaust line S2 are independently provided. However, for example, the exhaust line S2 shown in FIG. 5 may be formed as a line for the impurity monitoring detector 14a through which a small amount of a gas is allowed to flow, and the drain line S7 may be provided as the exhaust line which is also used as the drain line. In this case, condensed water may be received in a drain pan (not shown) provided for the exhaust line and then may be discharged outside.

At the initial startup of an apparatus or at the re-startup performed, for example, after maintenance and an inspection operation, when the circulation operation is again performed for the filter box 5 after it is exposed to the atmosphere, as the initial purge for replacing a gas inside the filter box 5 with an inert gas, which is preparation for the circulation operation, a step of depleting moisture of the filters is carried out. After the step of depleting moisture described above is performed, when the circulation operation is restarted, the moisture concentration can be maintained at a predetermined value or less from the initial stage of the circulation operation. Hence, an inert gas containing moisture at a high concentration generated from the filters can be prevented from flowing into the airtight chamber 1 in which an exposure apparatus is received. As a result, the adsorption of moisture on the surface of the exposure apparatus (particularly, optical element surfaces at two ends of a projection optical system) can be prevented, and re-desorption of moisture adsorbed thereon can also be prevented, so that the exposure apparatus can be placed in an inert gas atmosphere having a higher purity and higher purity stability. Accordingly, advantages, such that the transmittance of exposure light transmitting through an inert gas is not likely to be changed and that the optical element surfaces are unlikely to haze, can be obtained.

Embodiment 4

Figure 6:
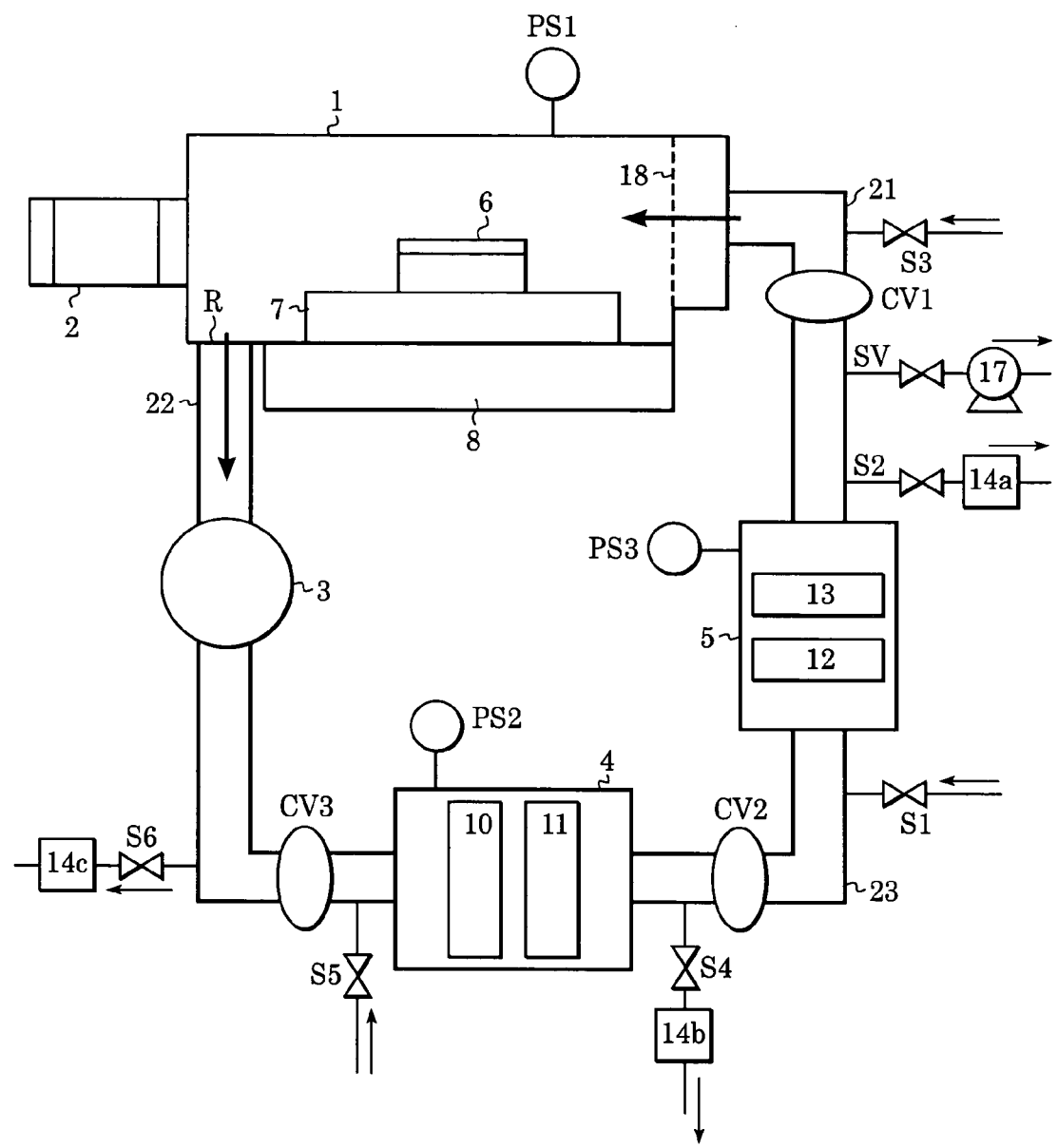
FIG. 6 is a schematic view showing the structure of a gas circulating air-conditioning device as an inert gas circulating device of an exposure apparatus according to Embodiment 4 of the present invention.

FIG. 6 is a schematic view showing a gas circulating air-conditioning device as an inert gas circulating device of an exposure apparatus according to Embodiment 4 of the present invention. In Embodiment 3 shown in FIG. 5, by the use of the heating device 15, the filters are heated, and as a result, the moisture contained therein is depleted. However, in this embodiment, unlike Embodiment 3, the moisture is depleted by evacuating the inside of the filter box 5 using a vacuum pump 17.

Hereinafter, a method for depleting moisture of the filters, according to this embodiment, will be described. First, in the state in which the blower 3 and the air conditioner 4 are stopped, the circulation path valves CV1 and CV2 are closed. At a time between right before and right after closing the circulation path valves CV1 and CV2, the supply of an inert gas from the inert gas supply path S1 is started to exhaust a gas in the filter box 5 outside from the exhaust path S2 so that the replacement with an inert gas is performed in the filter box 5. Next, after the valves of the inert gas supply path S1 and exhaust path S2 are closed, the vacuum pump 17 is driven, so that the inside of the filter box 5 is evacuated.

Furthermore, a valve of this vacuum line SV is closed, and an inert gas is again supplied from the inert gas supply path S1 into the filter box 5 which is already placed in a vacuum state. When the pressure of the filter box 5 is changed from a vacuum pressure to atmospheric pressure by the supply of the inert gas, the valve of the supply path S2 is closed, and the valve of the vacuum line is opened so that the inside of the filter box 5 is again evacuated. By repeating the evacuation and the supply of an inert gas as described above, which is called a batch purge, the step of depleting moisture of the filters can be efficiently performed within a short period of time.

In addition, in the case in which the batch purge described above is performed, when an inert gas heating device (not shown) is provided upstream of the inert gas supply path S1 so that the filters are indirectly heated by supplying a heated inert gas, or a heater (not shown) is provided in the filter box 5 so that the filters are directly heated, the step of depleting moisture of the filters can be more efficiently performed within a short period of time.

Furthermore, as shown in FIG. 6, when the circulation path valves CV1 and CV2 are closed, the airtightness of the filter box 5 can be independently ensured. Accordingly, the filter box 5 and parts of the circulation path at the two ends thereof may only be formed so as to have the rigidity which can withstand vacuum pressure, and the airtight chamber 1 and the air conditioner 4 may be formed to have a relatively small rigidity which withstands approximately atmospheric pressure as is the case of a related exposure apparatus; hence, manufacturing of the exposure apparatus can be advantageously performed at relatively low cost.

In addition, when the filters are heated in Embodiment 3 or 4, at least one of a sheet heating device and a sheet heat insulating material may be provided on the surface of a housing of the filter box 5, and when provided, the sheet heating device is simultaneously operated with the heating device for the filters. By this structure, since the heating efficiency of the filters can be improved, and the temperature distribution in the filter box 5 can also be improved, the step of depleting moisture can be performed within a shorter period of time and with a smaller amount of energy, and as a result, advantages, such that the productivity of the exposure apparatus is improved, and that the running cost thereof is suppressed, can be obtained.

In addition, when pressure sensors PS1, PS2, and PS3 are provided for the spaces sealed by closing the individual circulation path valves, and an absolute pressure of each space or a differential pressure between the pressure thereof and atmospheric pressure is measured, a function may be designed which stops the supply of an inert gas or opens the inert gas exhaust path in the case in which the pressure exceeds a predetermined value. In this case, even when the pressure of one of the spaces exceeds a predetermined value, the function described above can advantageously avoid an accident so that the pressure will not exceed abnormal pressure, which may cause damage such as destruction of housings or devices, in purging the individual spaces with an inert gas. Of course, the same advantages described above can be obtained during circulation of an inert gas.

In addition, in Embodiments 2 to 4, the air conditioner 4 and the filter box 5 are separately provided; however, the air conditioner 4 and the filter box 5 may be received in one housing, that is, for example, the filters 12 and 13 may be received in the air conditioner 4. In this case, when the heating device 15 is also provided for heating the filters 12 and 13, one heating device may only be provided which is used as the heating device 11 for heating and temperature controlling of a circulated gas and is also used as the heating device 15 for heating the filters, and as a result, the air conditioner 4 can be advantageously miniaturized. Furthermore, in the case described above, when one temperature control device is only provided for controlling individual temperatures by switching over between the temperature sensors Ts1 and Ts2, the miniaturization and cost reduction of the apparatus can be advantageously achieved at the same time.

As the inert gas used in Embodiments 1 to 4, air, nitrogen, helium, argon, and a mixed gas thereof may be optionally used, and when an inert gas introduced into lens-barrels of an illumination optical system and a projection optical system for replacing gases therein is reused when it is exhausted, material cost of the inert gas can be decreased, and as a result, the running cost of the exposure apparatus can also be advantageously decreased.

In Embodiments 2 to 4, when the step of depleting moisture contained in the filters is performed, as the inert gas introduced into the filter box 5, an inert gas having a purity lower than a predetermined value may be used at the initial stage and may then be switched over to an inert gas having an appropriate purity which is used in circulation. Accordingly, it is expected that the material cost of the inert gas can be decreased since the price of an inert gas is increased as the purity thereof is increased. In addition, when dry air is used instead of the inert gas having a low impurity which is used at the initial stage and is then switched over to an inert gas having an appropriate purity which is used in circulation, the material cost of the inert gas may be further advantageously decreased.

Embodiment of Method for Manufacturing Devices (Embodiment of a Method for Manufacturing Devices)

Figure 7:
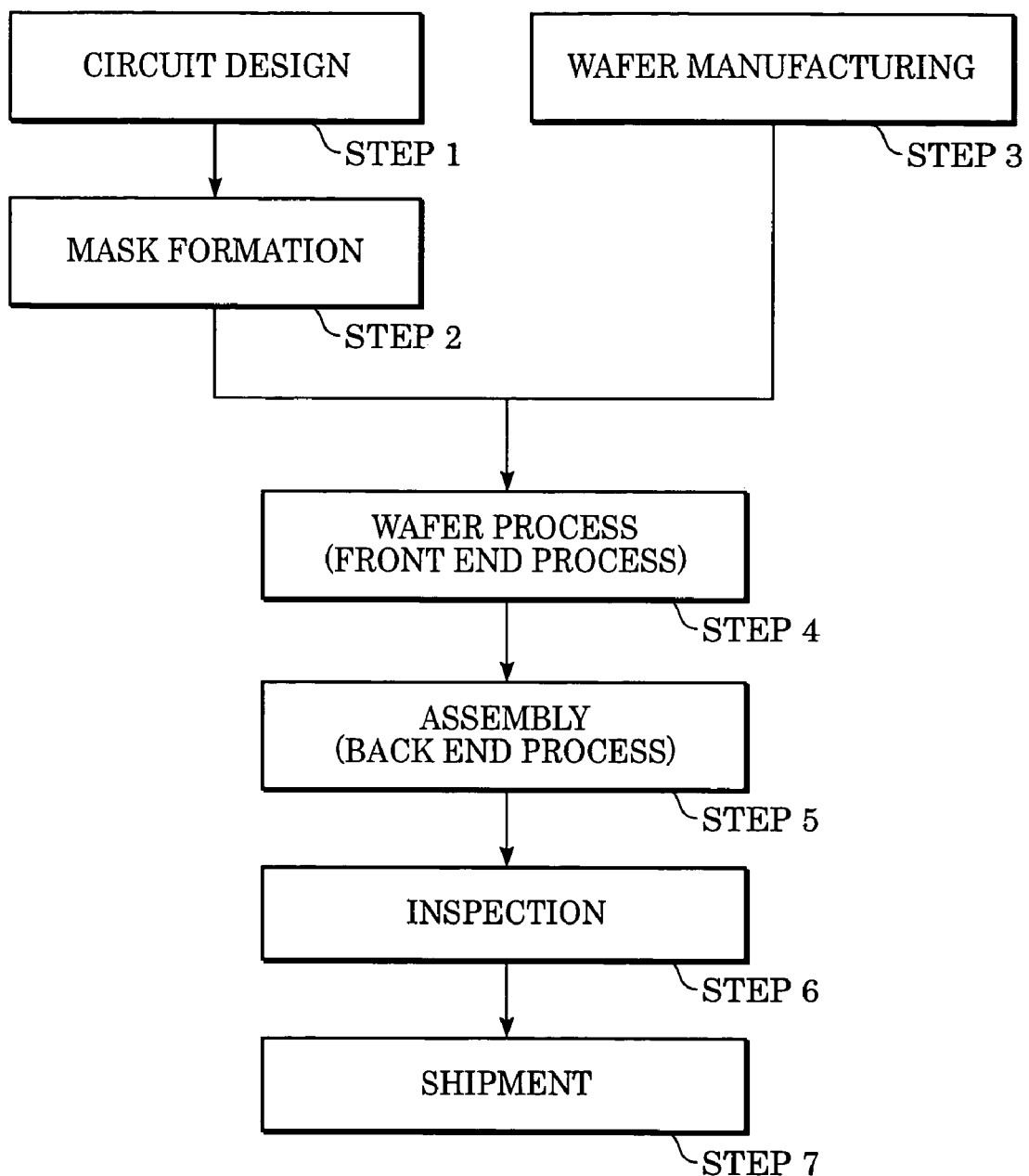
FIG. 7 is a flowchart showing a method for manufacturing a micropatterned device.

FIG. 7 is a flowchart of a method for manufacturing a micropatterned device (e.g., a semiconductor chip such as an IC or LSI, a liquid crystal panel, a CCD, a thin film magnetic head, a micromachine, or the like). In Step 1 (circuit design), a pattern design of a device is performed. In Step 2 (mask formation), a mask provided with the pattern designed in the previous step is formed. In addition, in Step 3 (wafer manufacturing), a wafer is manufactured using a material, such as silicon or glass. In Step 4 (wafer process), which is called a front end process, an actual circuit is formed on the wafer thus manufactured using the mask described above by a lithographic technique. In Step 5 (assembly), which is called a back end process, semiconductor chips are formed from the wafer processed in Step 4, and Step 5 includes, for example, an assembly substep (dicing and bonding) and a packaging substep (chip encapsulation). In Step 6 (inspection), tests of operation performance, durability, and the like, are performed for the semiconductor device formed in Step 5. Through the steps described above, the semiconductor device is completed and is then shipped (Step 7).

Figure 8:
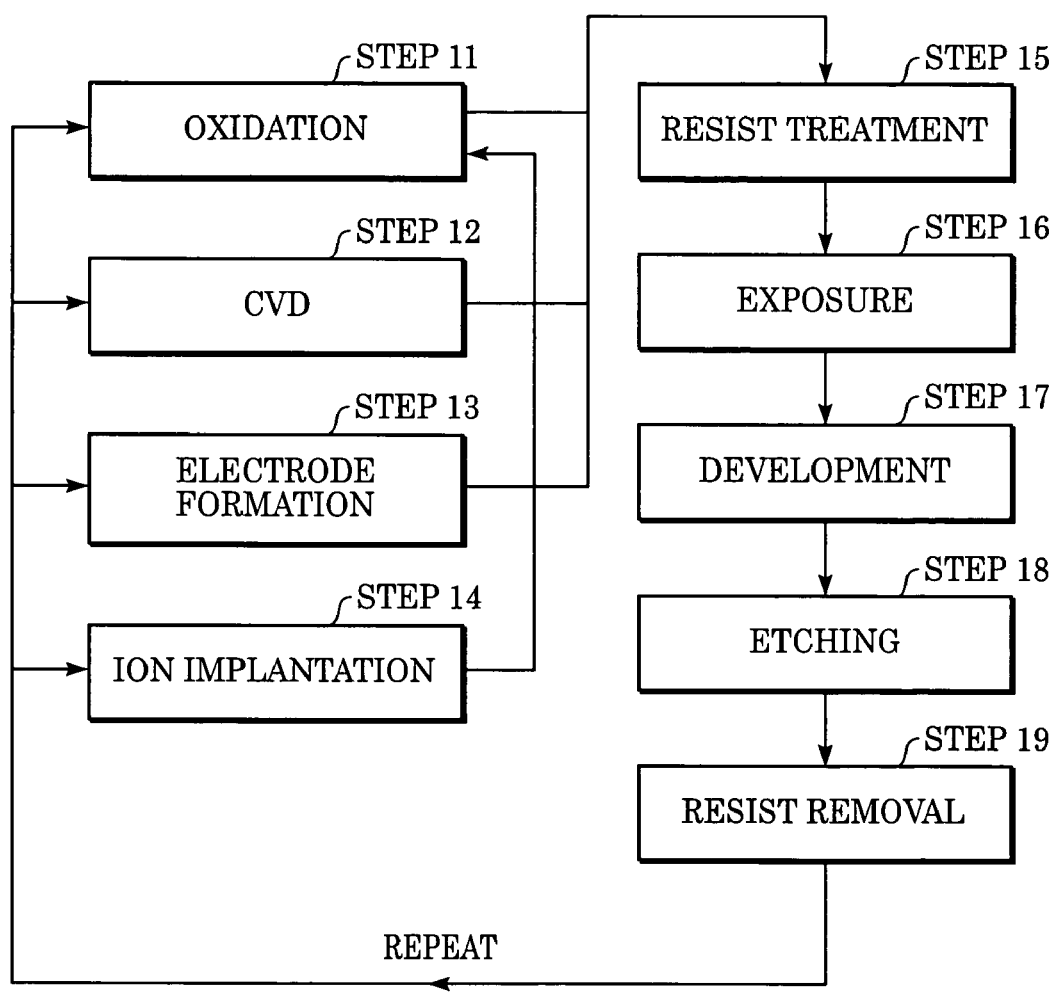
FIG. 8 is a detailed flowchart of the wafer process shown in FIG. 7.

FIG. 8 shows a detailed flowchart of the wafer process described above. In Step 11 (oxidation), the surface of the wafer is oxidized. In step 12 (CVD), an insulating film is formed on the wafer surface. In Step 13 (electrode formation), electrodes are formed on the wafer by deposition. In Step 14 (ion implantation), ions are implanted in the wafer. In Step 15 (resist treatment), a photosensitive agent is applied onto the wafer. In Step 16 (exposure), a circuit pattern of the mask is exposed onto the wafer by the exposure apparatus described above which is one of semiconductor-manufacturing apparatuses. In Step 17 (development), the wafer thus exposed is developed. In Step 18 (etching), part of the resist other than that developed is etched away. In Step 19 (resist removal), an unnecessary resist remaining after etching is removed. The steps described above are repeated, and as a result, multilayer circuit patterns can be formed on the wafer.

According to the manufacturing method of this embodiment, highly integrated devices, which are difficult to produce in the past, can be produced at low cost.

The present invention is not limited to the above embodiments and various changes and modifications can be made within the spirit and scope of the present invention. Therefore, to apprise the public of the scope of the present invention the following claims are made.

What is claimed is:

1. An exposure apparatus for exposing a substrate to light, said exposure apparatus comprising:
    a chamber configured to enclose a space through which the light passes;
    a circulation system having a path connected to the space and configured to circulate inert gas through the path and the space;
    at least one valve provided in the path and configured to openably close the path to define both ends of a first zone including the space;
    a supply system having a supply port at one of the both ends and configured to supply the inert gas to the first zone through said supply port with said valve closed; and
    an exhaust system having an exhaust port at the other of the both ends and configured to exhaust gas from the first zone through said exhaust port with said valve closed.

2. An apparatus according to claim 1, wherein said at least one valve is configured to further define a second zone of the path, said supply system being further configured to supply the inert gas to the second zone with said valve closed, said exhaust system being further configured to exhaust gas from the second zone with said valve closed.

3. An apparatus according to claim 2, further comprising a filter provided in one of the first and second zones and configured to remove contaminants in the path.

4. An apparatus according to claim 3, further comprising a removal system configured to remove moisture in said filter.

5. An apparatus according to claim 4, wherein said removal system comprises a heater configured to heat said filter.

6. An apparatus according to claim 5, wherein said removal system comprises a drain configured to discharge condensed water.

7. An apparatus according to claim 4, wherein said removal system comprises a vacuum pump configured to evacuate the zone in which said filter is provided.

8. An apparatus according to claim 1, further comprising a detector configured to detect a concentration of an impurity in gas in the first zone.

9. An apparatus according to claim 8, wherein said valve is configured to be opened based on a detection performed by said detector.

10. An apparatus according to claim 1, further comprising at least one of a blower configured to blow gas in the path, a filter configured to remove contaminants in the path, and a temperature control system configured to control the temperature of gas in the path.

11. A method according to claim 10, further comprising a step of detecting, by a detector, a concentration of an impurity in gas in the zone.

12. A method according to claim 11, further comprising a step of opening the at least one valve based on the detection performed in the detecting step.

13. A device manufacturing method comprising steps of:
    exposing a substrate to a pattern using an exposure apparatus as defined in claim 1;
    developing the exposed substrate; and
    processing the developed substrate to manufacture the device.

14. An atmosphere control method adapted to an exposure apparatus for exposing a substrate to light, the exposure apparatus including a chamber configured to enclose a space through which the light passes and a circulation system having a path connected to the space and configured to circulate inert gas through the path and the space, said method comprising steps of:
    closing at least one valve provided in the path to define both ends of a zone including the space;
    supplying inert gas to one of the both ends with the valve closed; and
    exhausting gas from the other of the both ends with the valve closed.

* * * * *

UNITED STATES PATENT AND TRADEMARK OFFICE
CERTIFICATE OF CORRECTION

| | | |
|---|---|---|
| PATENT NO. | : 7,145,629 B2 | Page 1 of 2 |
| APPLICATION NO. | : 10/976848 | |
| DATED | : December 5, 2006 | |
| INVENTOR(S) | : Hitoshi Nakano | |

It is certified that error appears in the above-identified patent and that said Letters Patent is hereby corrected as shown below:

COLUMN 2:
    Line 3, "to be" should be deleted.

COLUMN 3:
    Line 60, ""dominantly" should read -- predominantly --.

COLUMN 6:
    Line 37, "of the zone" should read

--of the zone.
            According to the present invention, in an exposure apparatus using ultra violet rays such as fluorine excimer laser beams, an inert gas atmosphere having a high purity can be obtained within a short period of time by supplying a small amount of an inert gas, and as a result, high productivity and inexpensive running cost can be simultaneously realized. --

Lines 38-67 should be deleted in their entirety.

COLUMN 7:
    Lines 1-4 should be deleted in their entirety.

COLUMN 11:
    Line 23, "filer box" should read -- filter box --.
    Line 59, "airtightness may be" should read as follows:

-- airtightness may only be continuously replaced with an inert gas. Furthermore, when the airtightness of the two spaces of the air conditioner 4 and the filter box 5 is not sufficient, by using the inert gas circulation path S5 and exhaust path S2 while the circulation path valve CV2 is not closed, gases in the two spaces having insufficient airtightness may be --.

COLUMN 13:
    Line 31, "co., Ltd.," should read -- Co., Ltd., --.
    Line 45, "much" should be deleted.

UNITED STATES PATENT AND TRADEMARK OFFICE
CERTIFICATE OF CORRECTION

PATENT NO. : 7,145,629 B2
APPLICATION NO. : 10/976848
DATED : December 5, 2006
INVENTOR(S) : Hitoshi Nakano It is certified that error appears in the above-identified patent and that said Letters Patent is hereby corrected as shown below:

COLUMN 16:
Line 33, "Embodiment of Method for Manufacturing Devices" should be deleted.
After line 34, and before line 35, insert the following paragraph:

-- Next, an embodiment of a method of manufacturing a device by the use of the exposure apparatus described above will be described. --

Signed and Sealed this

Twenty-second Day of May, 2007

JON W. DUDAS
*Director of the United States Patent and Trademark Office*